United States Patent
Wu et al.

(10) Patent No.: US 10,776,602 B2
(45) Date of Patent: Sep. 15, 2020

(54) PRINT RECOGNITION MODULE, METHOD FOR DRIVING THE SAME, AND DISPLAY DEVICE

(71) Applicant: BOE Technology Group Co., Ltd., Beijing (CN)

(72) Inventors: Chun-Wei Wu, Beijing (CN); Xue Dong, Beijing (CN); Haisheng Wang, Beijing (CN); Yingming Liu, Beijing (CN); Xiaoliang Ding, Beijing (CN)

(73) Assignee: BOE Technology Group Co., Ltd.. LTD., Beijing (CN)

( * ) Notice: Subject to any disclaimer, the term of this patent is extended or adjusted under 35 U.S.C. 154(b) by 279 days.

(21) Appl. No.: 15/764,578

(22) PCT Filed: Sep. 8, 2017

(86) PCT No.: PCT/CN2017/101123
§ 371 (c)(1),
(2) Date: Mar. 29, 2018

(87) PCT Pub. No.: WO2018/153055
PCT Pub. Date: Aug. 30, 2018

(65) Prior Publication Data
US 2020/0151416 A1    May 14, 2020

(30) Foreign Application Priority Data
Feb. 24, 2017    (CN) .......................... 2017 1 0103856

(51) Int. Cl.
G06K 9/00    (2006.01)
G02F 1/1333  (2006.01)
(Continued)

(52) U.S. Cl.
CPC ....... G06K 9/0004 (2013.01); G02F 1/13338 (2013.01); G02F 1/136209 (2013.01);
(Continued)

(58) Field of Classification Search
CPC .............. G06K 9/0004; G02F 1/13338; G02F 1/136209; G02F 1/136286; H01L 27/323
(Continued)

(56) References Cited

U.S. PATENT DOCUMENTS 4,096,992 A * 6/1978 Nojiri ................... G06K 7/016
                                                235/462.18
4,924,254 A * 5/1990 Dwyer, III .......... G03B 15/003
                                                355/20
(Continued)

FOREIGN PATENT DOCUMENTS

CN    104182727 A    12/2014
CN    105487225 A    4/2016
(Continued)

OTHER PUBLICATIONS

PCT/CN2017/101123 International Search Report dated Dec. 8, 2017.

Primary Examiner — Prabodh M Dharia
(74) Attorney, Agent, or Firm — Arent Fox LLP; Michael Fainberg

(57) ABSTRACT

A print recognition module, a method for driving the same, and a display device are disclosed, where a synchronous scan component is added above a sensing surface of a photo sensor array, and the synchronous scan component can be divided into a first light shielding area and a first light transmitting area, both of which are varying dynamically; where the first light transmitting area is formed at least above a photo sensor being scanned to recognize a print, and the first light shielding area can shield the other photo sensors than the photo sensor being scanned to recognize the print, so that these photo sensors will not be illuminated by any light; and as the photo sensors are being scanned, the first light shielding area and the first light transmitting area,
(Continued)

in the synchronous scan component are varying in synchronization therewith.

17 Claims, 4 Drawing Sheets

(51) Int. Cl.
    *G02F 1/1362*     (2006.01)
    *H01L 27/32*     (2006.01)

(52) U.S. Cl.
    CPC ...... *G02F 1/136286* (2013.01); *H01L 27/323* (2013.01); *G02F 2201/123* (2013.01)

(58) Field of Classification Search
    USPC ................ 345/156, 206; 355/20; 358/173
    See application file for complete search history.

(56) References Cited

U.S. PATENT DOCUMENTS

| | | | | |
|---|---|---|---|---|
| 5,016,040 A * | 5/1991 | Dwyer, III | ........... | G03B 15/003 355/20 |
| 5,204,755 A * | 4/1993 | Taga | ................ | H04N 1/00352 165/80.3 |
| 6,347,190 B1 * | 2/2002 | Ishimaru | ................ | G03B 17/20 396/121 |
| 6,731,785 B1 * | 5/2004 | Mennie | ................ | G07D 7/12 209/534 |
| 2004/0220753 A1 * | 11/2004 | Tabe | ................ | G01N 33/0057 702/32 |
| 2005/0169110 A1 * | 8/2005 | Mazzilli | ................ | G04G 13/02 368/73 |
| 2009/0021798 A1 * | 1/2009 | Abahri | ................ | H04N 1/195 358/474 |
| 2010/0055042 A1 * | 3/2010 | Yathindranath | ...... | A61K 9/5115 424/9.36 |
| 2010/0265226 A1 * | 10/2010 | Yasuda | ................ | G09G 3/3666 345/206 |
| 2015/0054792 A1 | 2/2015 | Kuki | | |
| 2015/0319427 A1 * | 11/2015 | Wu | ................ | H04N 13/398 345/426 |
| 2016/0266695 A1 * | 9/2016 | Bae | ................ | G06F 1/1643 |
| 2017/0193270 A1 | 7/2017 | Zhang | | |
| 2018/0089491 A1 * | 3/2018 | Kim | ................ | G06K 9/00912 |
| 2018/0233681 A1 * | 8/2018 | Tang | ................ | H01L 51/56 |
| 2019/0377858 A1 * | 12/2019 | He | ................ | G06F 3/044 |

FOREIGN PATENT DOCUMENTS

| | | |
|---|---|---|
| CN | 106022292 A | 10/2016 |
| CN | 106154635 A | 11/2016 |
| CN | 205910951 U | 1/2017 |
| CN | 106897696 A | 6/2017 |

\* cited by examiner

PRINT RECOGNITION MODULE, METHOD FOR DRIVING THE SAME, AND DISPLAY DEVICE

This application is a National Stage of International Application No. PCT/CN2017/101123, filed Sep. 8, 2017, which claims priority to Chinese Patent Application No. 201710103856.5, filed Feb. 24, 2017, both of which are hereby incorporated by reference in their entireties.

TECHNICAL FIELD

This discourse relates to the field of display technologies, and particularly to a print recognition module, a method for driving the same, and a display device.

BACKGROUND

Photo sensors arranged in a matrix, and data lines connected with respective columns of the photo sensors are typically arranged in an existing device for recognizing a print, e.g., a fingerprint, etc., to perform a function of recognizing the print. The print is recognized by scanning respective rows of the photo sensors in sequence to read electrical signals generated and transmitted by the respective rows of the photo sensors to their connected data lines. However, all the photo sensors are illuminated by light while the print is being recognized, so that leakage current may be generated in all the photo sensors. The leakage current is noise in all the other photo sensors than a photo sensor being scanned. Therefore, how to alleviate the noise becomes an urgent problem to be solved in this field.

SUMMARY

Embodiments of the disclosure provide a print recognition module, a method for driving the same, and a display device.

An embodiment of the disclosure provides a print recognition module, including: a photo sensor array including a plurality of photo sensors for recognizing a print; and a synchronous scan component arranged above a sensing surface of the photo sensor array, wherein: when respective photo sensors in the photo sensor array are recognizing the print, the synchronous scan component is configured to have a first light shielding area and a first light transmitting area, both of which are varying dynamically, wherein the first light transmitting area is formed at least above a photo sensor being scanned to recognize the print, and the first light shielding area is the other area of the synchronous scan component than the first light transmitting area.

In an optional implementation, in the print recognition module above according to the embodiment of the disclosure, the synchronous scan component is a liquid crystal panel or a piece of transparent electronic paper.

In an optional implementation, in the print recognition module above according to the embodiment of the disclosure, a distribution density of a pixel array of the synchronous scan component is same as a distribution density of the photo sensors of the photo sensor array.

In an optional implementation, in the print recognition module above according to the embodiment of the disclosure, the first light transmitting area is only formed above the photo sensor being scanned to recognize the print.

In an optional implementation, in the print recognition module above according to the embodiment of the disclosure, the liquid crystal panel includes: a plurality of block-shaped pixel electrodes distributed at a same density as the photo sensor array, a black matrix with a grid-like structure arranged among respective pixel electrodes, and a plurality of metal lines conducting the respective pixel electrodes in a row or column direction, wherein: an orthographic projection of the grid-like structure of the black matrix onto the liquid crystal panel overlaps with orthographic projections of the respective pixel electrodes onto the liquid crystal panel; and orthographic projections of respective metal lines onto the liquid crystal panel are covered by the orthographic projection of the grid-like structure of the black matrix onto the liquid crystal panel.

In an optional implementation, in the print recognition module above according to the embodiment of the disclosure, a width of the black matrix between two adjacent columns of the pixel electrodes ranges from 5 to 10 μm.

In an optional implementation, in the print recognition module above according to the embodiment of the disclosure, the print recognition module further includes at least one block-shaped conductive structure formed integrally with the metal lines, an orthographic projection of the block-shaped conductive structure onto the liquid crystal panel does not overlap with the orthographic projection of the grid-like structure of the black matrix onto the liquid crystal panel, and the block-shaped conductive structure has a hollow area.

In an optional implementation, in the print recognition module above according to the embodiment of the disclosure, each pixel in the synchronous scan component is arranged corresponding to at least two adjacent photo sensors in a same column of the photo sensor array in a one-to-one manner.

In an optional implementation, in the print recognition module above according to the embodiment of the disclosure, each pixel in the synchronous scan component is arranged corresponding to at least two adjacent photo sensors in a same row of the photo sensor array in a one-to-one manner.

In an optional implementation, in the print recognition module above according to the embodiment of the disclosure, the print recognition module further includes a light collimation member arranged between the photo sensor array, and the synchronous scan component, and the light collimation member has a second light transmitting area above the respective photo sensors, and a second light shielding area, which is the other area thereof than the second light transmitting area.

In another aspect, an embodiment of the disclosure further provides a method for driving the print recognition module above, the method including: scanning the respective photo sensors in the photo sensor array to recognize the print; and driving the synchronous scan component to form the first light transmitting area at least in an area above a photo sensor being scanned to recognize the print, and to form the first light shielding area in an area other than the first light transmitting area, when the respective photo sensors are being scanned to recognize the print.

In an optional implementation, in the driving method above according to the embodiment of the disclosure, scanning the respective photo sensors in the photo sensor array to recognize the print includes: scanning the respective photo sensors in the photo sensor array via a row scan mode or a column scan mode to recognize the print.

In an optional implementation, in the driving method above according to the embodiment of the disclosure, driving the synchronous scan component to form the first light transmitting area at least in the area above the photo sensor being scanned to recognize the print, includes: driving the synchronous scan component to form the first light transmitting area extending in a row direction at least in an area above a row including the photo sensor being scanned to recognize the print, when the respective photo sensors in the photo sensor array are being scanned via the row scan mode to recognize the print; or driving the synchronous scan component to form the first light transmitting area extending in a column direction at least in an area above a column including the photo sensor being scanned to recognize the print, when the respective photo sensors in the photo sensor array are being scanned via the column scan mode to recognize the print.

In another aspect, an embodiment of the disclosure further provides a display device including a display module, and the print recognition module above according to the embodiments of the disclosure.

In an optional implementation, in the display device above according to the embodiment of the disclosure, the display module is a top-emitting OLED display panel, the print recognition module is arranged below a display area of the top-emitting OLED display panel, and the synchronous scan component in the print recognition module is located between the photo sensor array, and the top-emitting OLED display panel.

In an optional implementation, in the display device above according to the embodiment of the disclosure, the print recognition module is arranged in a non-display area of the display module.

In an optional implementation, in the display device above according to the embodiment of the disclosure, the display module is an OLED display panel or a liquid crystal display panel.

DETAILED DESCRIPTION OF THE EMBODIMENTS

Figure 1:
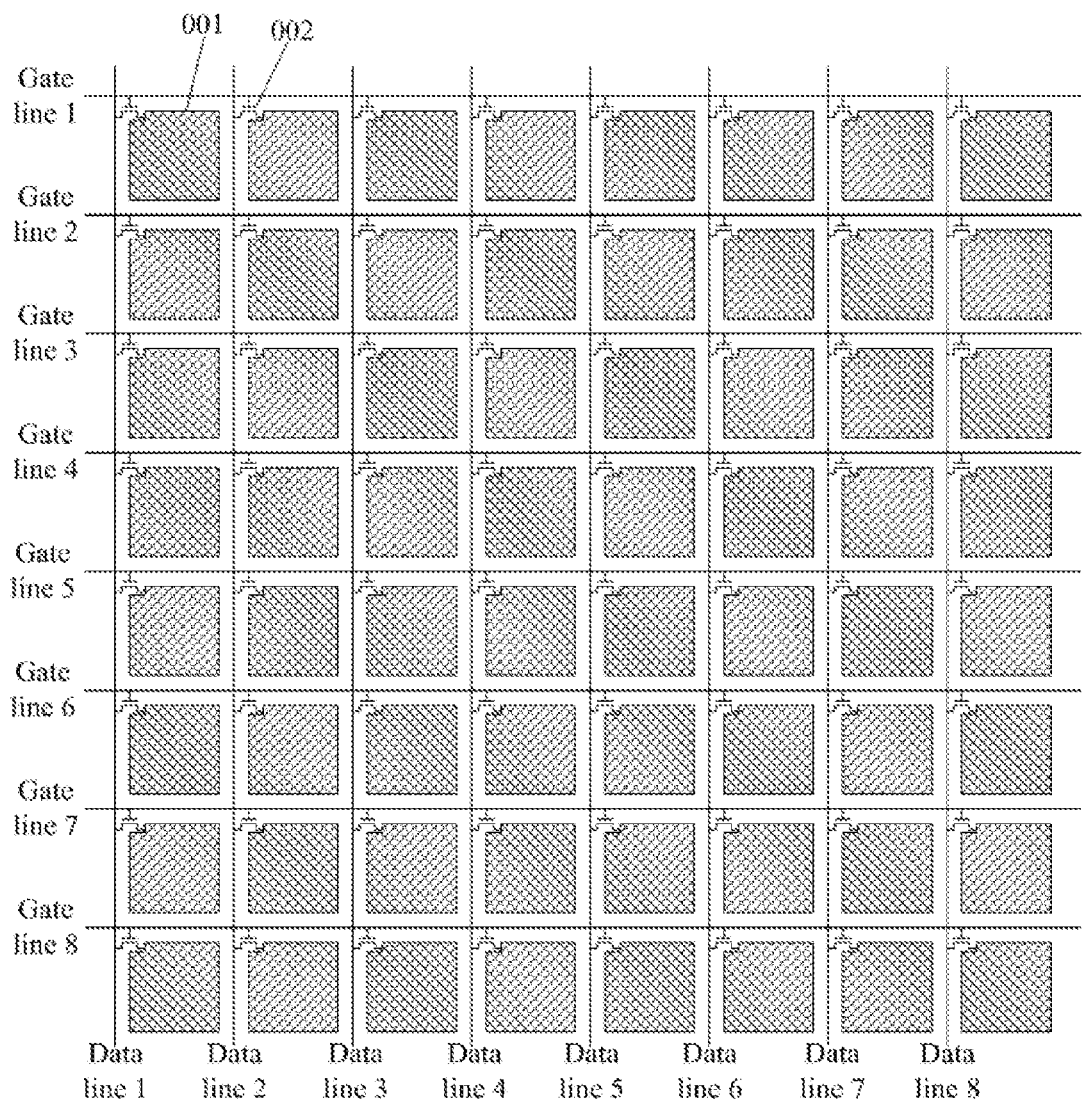
FIG. 1 is a schematic structural diagram of a print recognition device in the prior art.

Particular implementations of a print recognition module, a method for driving the same, and a display device according to the embodiments of the disclosure will be described below in details with reference to the drawings.

The shapes and sizes of respective components in the drawings are not intended to reflect any real proportion of the print recognition module, but merely intended to illustrate the disclosure.

At present, a print recognition device generally uses a plurality of photo sensors 001 arranged in an array, as illustrated in FIG. 1, to perform a function of recognizing a print, where each photo sensor 001 is connected with a source of a switch transistor 002 corresponding thereto in a one-to-one manner, each row of the photo sensors 001 is connected with a gate line Gate through a gate of a switch transistor 002 corresponding thereto in a one-to-one manner, and each column of the photo sensors 001 is connected with a data line Data through a drain of a switch transistor 002 corresponding thereto in a one-to-one manner. A print is recognized by applying a scan signal to respective rows of gate lines in sequence, where when the scan signal is applied to one row of the gate lines, a row of switch transistors 002 connected therewith is turned on, and other rows of the switch transistors 002 are turned off. Electrical signals of photo sensors 001 corresponding to the row of the switch transistors 002, which are turned on, are read on respective data lines Data. However, all the photo sensors 001 are illuminated by light, so that leakage current may be generated in all the photo sensors 001, and the leakage current is noise in connected switch transistors 002 which are turned off. In order to avoid the noise, it is typically required to ideally turn off the switch transistors 002, through which the photo sensors 001 are connected with the data lines Data, to thereby block the leakage current in the photo sensors 001 from being transmitted to their connected data lines Data through the switch transistors 002 so as to prevent the leakage current, which is the noise, in the other rows of the photo sensors 001 from being read on the data lines. Although the switch transistors 002 can be embodied at present as oxide switch transistors instead of poly-silicon switch transistors to thereby theoretically alleviate the noise of the leakage current by a factor of approximately 80%, some noise of the leakage current still remains.

Figure 2A:
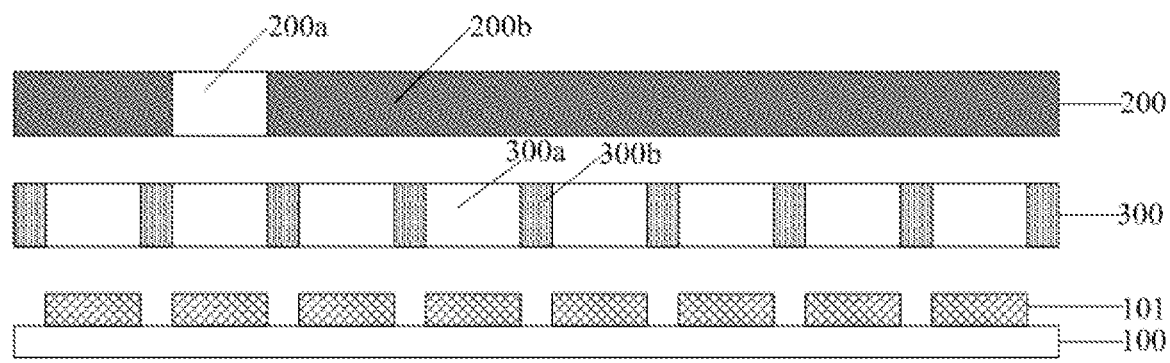
FIG. 2A and FIG. 2B are respective schematic structural diagrams of a print recognition module according to embodiments of the disclosure.
Figure 2B:
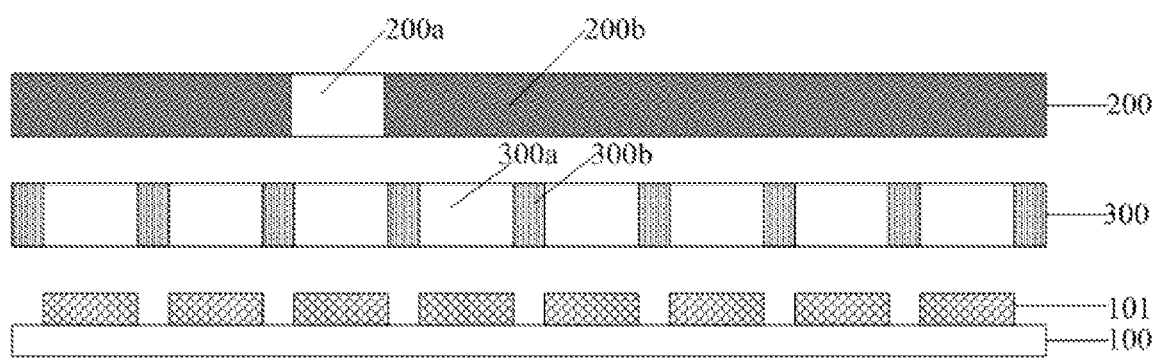

In view of this, embodiments of the disclosure provide a print recognition module, as illustrated in FIG. 2A and FIG. 2B, where the print recognition module includes: a photo sensor array 100 including a plurality of photo sensors 101 for recognizing a print, and a synchronous scan component 200 arranged above a sensing surface of the photo sensor array 100, where: when respective photo sensors 101 in the photo sensor array 100 are recognizing the print, the synchronous scan component 200 is divided into a first light shielding area 200b and a first light transmitting area 200a, both of which are varying dynamically, where the first light transmitting area 200a is formed at least above a photo sensor 101 being scanned to recognize the print. And FIG. 2A illustrates the first light transmitting area 200a positioned above a second photo sensor, counted from a left side, being scanned to recognize the print, by way of an example, and FIG. 2B illustrates the first light transmitting area 200a positioned above a third photo sensor, counted from the left side, being scanned to recognize the print, by way of an example.

In the print recognition module above according to the embodiments of the disclosure, the synchronous scan component 200 is added above the sensing surface of the photo sensor array 100, and the synchronous scan component 200 can be divided into the first light shielding area 200b and the first light transmitting area 200a, both of which are varying dynamically, when the respective photo sensors 101 in the photo sensor array 100 are recognizing the print, where the first light transmitting area 200a is formed at least above the photo sensor 101 being scanned to recognize the print, so that the photo sensor 101 being scanned to recognize the print can receive reflected light from a finger smoothly through the first light transmitting area 200a. And the other area of the synchronous scan component 200 than the first light transmitting area 200a is the first light shielding area 200b, so that the other photo sensors 101 than the photo sensor 101 being scanned to recognize the print can be shielded, and these photo sensors 101 other than the photo sensor 101 being scanned to recognize the print will not be illuminated by any light to thereby avoid noise of leakage current from being generated in these photo sensors 101, and transmitted to their connected data lines. As the photo sensors 101 are being scanned, the first light shielding area 200b, and the first light transmitting area 200a, in the synchronous scan component 200 are varying in synchronization therewith, thus improving a signal to noise ratio of a signal to be read out on the data lines.

In a particular implementation, in the print recognition module above according to the embodiments of the disclosure, there are a number of particular implementations in which the first light shielding area 200b and the first light transmitting area 200a, of the synchronous scan component 200, are varying dynamically. And for example, the synchronous scan component 200 can be a liquid crystal panel or a piece of transparent electronic paper. Taking the liquid crystal panel as an example, when recognizing a print, as the respective photo sensors 101 in the photo sensor array 100 are being scanned, and their signals are being read, an area of the liquid crystal panel above a photo sensor 101 being scanned to recognize the print can be controlled to be the first light transmitting area 200a, and the other area of the liquid crystal panel than the first light transmitting area 200a can be controlled to be the first light shielding area 200b.

In a particular implementation, in the print recognition module above according to the embodiments of the disclosure, an arrangement pattern of pixels in the synchronous scan component 200 can be set according to desirable precision of shielding, and a distribution pattern of the respective photo sensors 101 in the photo sensor array 100. Particularly if the first light transmitting area 200a is to be formed only above a photo sensor 101 being scanned to recognize the print, then a distribution density of a pixel array in the synchronous scan component 200 will be synchronized with a distribution density of the photo sensors 101 in the photo sensor array 100, that is, each pixel in the synchronous scan component 200 is arranged corresponding to one of the photo sensors 101 in the photo sensor array 100 in a one-to-one manner. At this time, if there is a high distribution density of the photo sensors 101, there will be also a high distribution density of the pixel array in the synchronous scan component 200, thus discouraging a fabrication cost from being lowered. In view of this, in a particular implementation, each pixel in the synchronous scan component can be arranged corresponding to at least two adjacent photo sensors in a same column of the photo sensor array in a one-to-one manner, so that the distribution density of the pixel array in the synchronous scan component 200 can be reduced as appropriate. For example, the distribution density of the pixel array in the synchronous scan component 200 can be halved, that is, each pixel in the synchronous scan component can be arranged corresponding to two adjacent photo sensors in a same column of the photo sensor array in a one-to-one manner, so that two rows of the photo sensors 101 correspond to one row of the first light transmitting areas 200a, and at this time, a scanning frequency of the synchronous scan component 200 will also be halved, as opposed to a scanning frequency of the photo sensor array, thus helps to lower a fabrication cost and power consumption. Of course, in a particular implementation, alternatively each pixel in the synchronous scan component can be arranged corresponding to at least two adjacent photo sensors in a same row of the photo sensor array in a one-to-one manner, so that the distribution density of the pixel array in the synchronous scan component can be lowered to thereby help to lower a fabrication cost.

Figure 3:
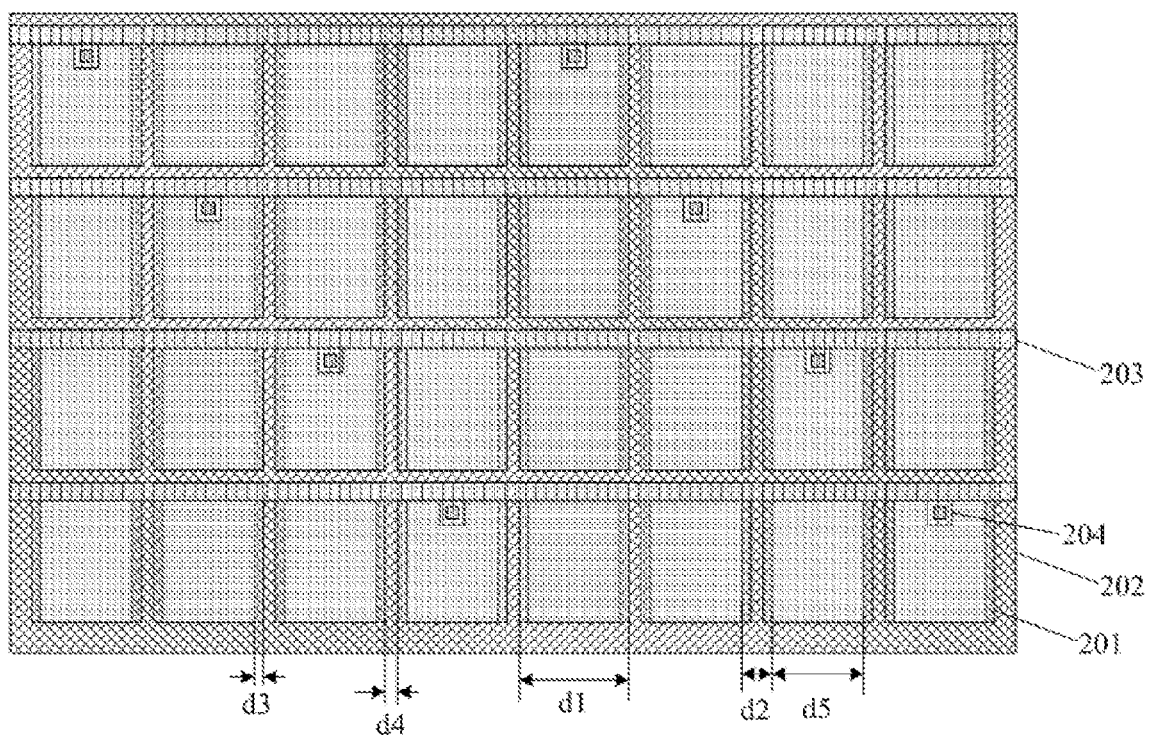
FIG. 3 is a schematic structural diagram of a liquid crystal panel in the print recognition module according to the embodiments of the disclosure.

In a particular implementation, in the print recognition module above according to the embodiments of the disclosure, the liquid crystal panel can be structured as the existing liquid crystal panel, i.e. an active-driven pixel structure, and in order to simplify the structure to lower the complexity of fabrication thereof, the liquid crystal panel can be driven passively, that is, respective pixels are not controlled by the switch transistors to be charged and discharged. As illustrated in FIG. 3, the liquid crystal panel can include: a plurality of block-shaped pixel electrodes 201 distributed at the same density as the photo sensor array, where each pixel electrode 202 belongs to one pixel; a black matrix 202 with a grid-like structure arranged among respective pixel electrodes 201; and a plurality of metal lines 203 conducting the respective pixel electrodes 201 in a row or column direction. Where in order to prevent light leakage, an orthographic projection of the grid-like structure of the black matrix 202 onto the liquid crystal panel overlaps with orthographic projections of the respective pixel electrodes 201 onto the liquid crystal panel; and orthographic projections of respective metal lines 203 onto the liquid crystal panel are covered by the orthographic projection of the grid-like structure of the black matrix 202 onto the liquid crystal panel, that is, the metal lines 203 arranged in an area of the grid-like structure of the black matrix 202, so that the respective pixel electrodes 201 in a row or a column are turned on by the metal lines 203, and also the pixels in the row or the column are controlled by the metal lines to form the first light transmitting area 200a or the first light shielding area 200b.

In a particular implementation, in the print recognition module above according to the embodiments of the disclosure, a width of each pixel electrode can be set to 58.438 μm in a row direction of the pixel electrodes. In a practical application, the width of each pixel electrode can be determined by a practical application environment, although the embodiments of the disclosure will not be limited thereto.

In a particular implementation, in the print recognition module above according to the embodiments of the disclosure, a width of the black matrix between two adjacent columns of the pixel electrodes can be 5 to 10 μm. Particularly the width of the black matrix between two adjacent pixel electrodes can be 5 μm, or the width of the black matrix between two adjacent pixel electrodes can be 10 μm. In a practical application, the width of the black matrix between two adjacent pixel electrodes can be determined by a practical application environment, although the embodiments of the disclosure will not be limited thereto.

In a particular implementation, in the print recognition module above according to the embodiments of the disclosure, a width of the black matrix between two adjacent rows of the pixel electrodes can be 10 μm. In a practical application, the width of the black matrix between two adjacent pixel electrodes can be determined by a practical application environment, although the embodiments of the disclosure will not be limited thereto.

The print recognition module can be fabricated in practical as illustrated in FIG. 3, where the width d1 of each pixel electrode 201 is set to 58.438 μm, the width d2 of the black matrix 202 is set to 10 μm, and the orthographic projection of the black matrix 202 onto the liquid crystal panel needs to overlap with the orthographic projections of the respective pixel electrodes 201 onto the liquid crystal panel in an overlapping area d3 with a width which is set to 2.5 μm, for example, so the spacing d4 between two adjacent columns of the pixel electrodes 201 is 5 μm, and the width d5 of an opening of each pixel electrode 201 is 53.438 μm, so an aperture ratio corresponding to the pixel electrode can be 79.18%.

In a particular implementation, in the print recognition module above according to the embodiments of the disclosure, in order to further lower the resistance of the metal lines 203 to avoid a signal from being transmitted with a delay, as illustrated in FIG. 3, the print recognition module can further include at least one block-shaped conductive structure 204 formed integrally with the metal lines 203, where an orthographic projection of the block-shaped conductive structure 204 onto the liquid crystal panel does not overlap with the orthographic projection of the grid-like structure of the black matrix 203 onto the liquid crystal panel, that is, the block-shaped conductive structure 204 is arranged in the opening areas of the pixels, and has a hollow area, that is, there is an opening therein.

In a particular implementation, in the print recognition module above according to the embodiments of the disclosure, as illustrated in FIG. 2A and FIG. 2B, the print recognition module can further include a light collimation member 300 arranged between the photo sensor array 100, and the synchronous scan component 200, where the light collimation member 300 has a second light transmitting area 300*a* above the respective photo sensors 101, and a second light shielding area 300*b*, which is the other area thereof than the second light transmitting area 300*a*. The light collimation member 300 can enable reflected light from a valley or a ridge of a finger to be fed back in effect to a corresponding photo sensor 101 to thereby avoid the photo sensor 101 from receiving reflected light from another valley or ridge, so as to improve the precision and definition of an image of a print to be recognized.

Based upon the same inventive concept of the disclosure, the embodiments of the disclosure further provide a method for driving the print recognition module above, and since the driving method addresses the problem under a similar principle to the print recognition module above, reference can be made to the implementation of the print recognition module for an implementation of this driving method, and a repeated description thereof will be omitted here.

Figure 4:
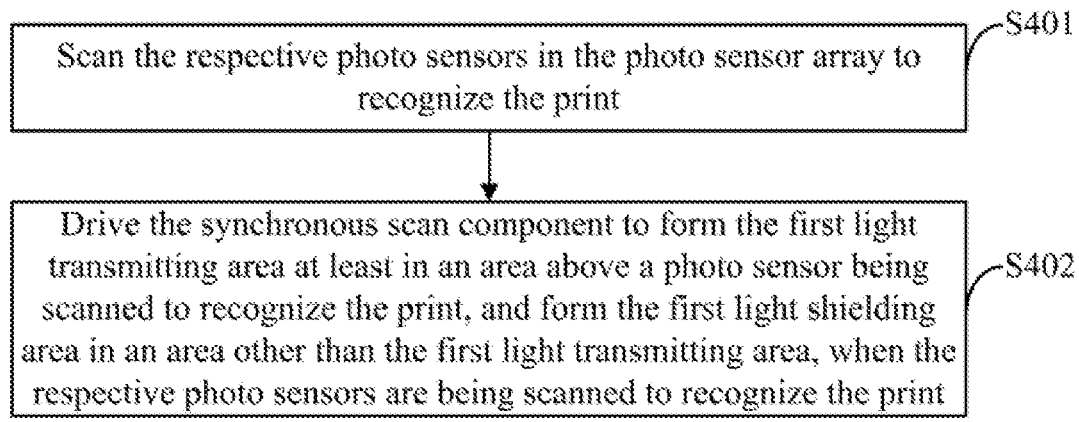
FIG. 4 is a flow chart of a method for driving the print recognition module according to the embodiments of the disclosure.

Particularly as illustrated in FIG. 4, a method for driving the print recognition module above according to the embodiments of the disclosure includes the following operations.

S401 is to scan the respective photo sensors in the photo sensor array to recognize the print.

S402 is to drive the synchronous scan component to form the first light transmitting area at least in an area above a photo sensor being scanned to recognize the print, and to form the first light shielding area in an area other than the first light transmitting area, when the respective photo sensors are being scanned to recognize the print.

In a particular implementation of the driving method above according to the embodiments of the disclosure, the respective photo sensors in the photo sensor array can be scanned to recognize the print, in S401 particularly by scanning the respective photo sensors in the photo sensor array via a row scan mode or a column scan mode to recognize the print, where the respective photo sensors are scanned via the row scan mode as described above in the print recognition module above.

In a particular implementation of the driving method above according to the embodiments of the disclosure, driving the synchronous scan component to form the first light transmitting area at least in the area above the photo sensor being scanned to recognize the print, in S402 particularly includes: driving the synchronous scan component to form the first light transmitting area extending in a row direction at least in an area above a row including the photo sensor being scanned to recognize the print, when the respective photo sensors in the photo sensor array are being scanned via the row scan mode to recognize the print; or driving the synchronous scan component to form the first light transmitting area extending in a column direction at least in an area above a column including the photo sensor being scanned to recognize the print, when the respective photo sensors in the photo sensor array are being scanned via the column scan mode to recognize the print.

Based upon the same concept of the disclosure, the embodiments of the disclosure further provide a display device including the print recognition module above according to the embodiments of the disclosure, and a display module. The display device can be a mobile phone, a tablet computer, a TV set, a display, a notebook computer, a digital photo frame, a navigator, or any other product or component with a display function. Reference can be made to the implementation of the print recognition module above for an implementation of the display device, and a repeated description thereof will be omitted here.

Figure 5:
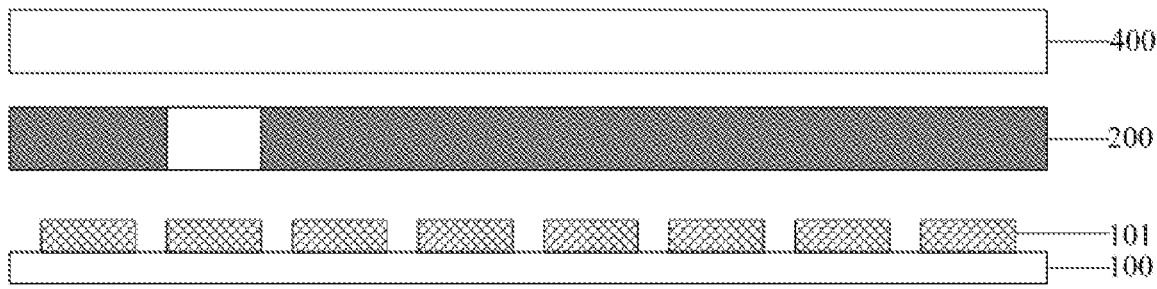
FIG. 5 is a first schematic structural diagram of a display device according to the embodiments of the disclosure.

Particularly there may be a number of relative positional relationships between the print recognition module, and the display module, and for example, the sensing area of the print recognition module can be arranged overlapping with a display area of the display module. In a particular implementation, in the display device above according to the embodiments of the disclosure, the display module can be a top-emitting OLED display panel, and at this time, as illustrated in FIG. 5, the print recognition module can be arranged below a display area of the top-emitting OLED display panel 400, and the synchronous scan component 200 in the print recognition module is located between the photo sensor array 100, and the top-emitting OLED display panel 400, so that the top-emitting OLED display panel 400 is further configured to provide light to illuminate the print recognition module, in addition to displaying.

Figure 6:
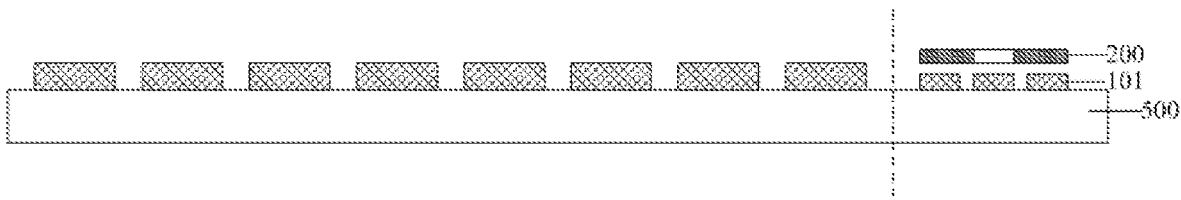
FIG. 6 is a second schematic structural diagram of the display device according to the embodiments of the disclosure.

In another example, the sensing area of the print recognition module can alternatively be arranged staggered from the display area of the display module. In a particular implementation, in the display device above according to the embodiments of the disclosure, as illustrated in FIG. 6, the print recognition module can be arranged be in a non-display area of the display module 500, that is, the print recognition function exists separately from the display function. At this time, the display module in the display device above according to the embodiments of the disclosure can be an OLED display panel, a liquid crystal display panel, or another flat display panel, although the embodiments of the disclosure will not be limited thereto.

In the print recognition module above, the method above for driving the same, and the display device above according to the embodiments of the disclosure, the synchronous scan component is added above the sensing surface of the photo sensor array, and the synchronous scan component can be divided into the first light shielding area and the first light transmitting area, both of which are varying dynamically. where the first light transmitting area is formed at least above the photo sensor being scanned to recognize the print, so that the photo sensor being scanned to recognize the print can receive reflected light from a finger smoothly through the first light shielding area, and the other area of the synchronous scan component than the first light transmitting area is the first light shielding area, so that the other photo sensors than the photo sensor being scanned to recognize the print can be shielded, and these photo sensors other than the photo sensor being scanned to recognize the print will not be illuminated by any light to thereby avoid noise of leakage current from being generated in these photo sensors, and transmitted to their connected data lines. As the photo sensors are being scanned, the first light shielding area, and the first light transmitting area, in the synchronous scan component are varying in synchronization therewith, thus improving a signal to noise ratio of a signal to be read out on the data lines.

Evidently those skilled in the art can make various modifications and variations to the invention without departing from the spirit and scope of the invention. Thus the invention is also intended to encompass these modifications and variations thereto so long as the modifications and variations come into the scope of the claims appended to the invention and their equivalents.

The invention claimed is:

1. A print recognition module, comprising:
 a photo sensor array comprising a plurality of photo sensors for recognizing a print; and
 a synchronous scan component arranged above a sensing surface of the photo sensor array, wherein:
 when respective photo sensors in the photo sensor array are recognizing the print, the synchronous scan component is configured to have a first light shielding area and a first light transmitting area, both of which are varying dynamically, wherein the first light transmitting area is formed at least above a photo sensor being scanned to recognize the print, and the first light shielding area is the other area of the synchronous scan component than the first light transmitting area.

2. The print recognition module according to claim 1, wherein the synchronous scan component is a liquid crystal panel or a piece of transparent electronic paper.

3. The print recognition module according to claim 2, wherein a distribution density of a pixel array of the synchronous scan component is same as a distribution density of the photo sensors of the photo sensor array.

4. The print recognition module according to claim 3, wherein the liquid crystal panel comprises: a plurality of block-shaped pixel electrodes distributed at a same density as the photo sensor array, a black matrix with a grid-like structure arranged among respective pixel electrodes, and a plurality of metal lines conducting the respective pixel electrodes in a row or column direction, wherein:
 an orthographic projection of the grid-like structure of the black matrix onto the liquid crystal panel overlaps with orthographic projections of the respective pixel electrodes onto the liquid crystal panel; and
 orthographic projections of the respective metal lines onto the liquid crystal panel are covered by the orthographic projection of the grid-like structure of the black matrix onto the liquid crystal panel.

5. The print recognition module according to claim 4, wherein a width of the black matrix between two adjacent columns of the pixel electrodes ranges from 5 to 10 μm.

6. The print recognition module according to claim 4, wherein the print recognition module further comprises at least one block-shaped conductive structure formed integrally with the metal lines, an orthographic projection of the block-shaped conductive structure onto the liquid crystal panel does not overlap with the orthographic projection of the grid-like structure of the black matrix onto the liquid crystal panel, and the block-shaped conductive structure has a hollow area.

7. The print recognition module according to claim 2, wherein each pixel in the synchronous scan component is arranged corresponding to at least two adjacent photo sensors in a same column of the photo sensor array in a one-to-one manner.

8. The print recognition module according to claim 2, wherein each pixel in the synchronous scan component is arranged corresponding to at least two adjacent photo sensors in a same row of the photo sensor array in a one-to-one manner.

9. The print recognition module according to claim 1, wherein the first light transmitting area is only formed above the photo sensor being scanned to recognize the print.

10. The print recognition module according to claim 1, wherein the print recognition module further comprises a light collimation member arranged between the photo sensor array, and the synchronous scan component, and the light collimation member has a second light transmitting area above the respective photo sensors, and a second light shielding area, which is the other area thereof than the second light transmitting area.

11. A method for driving the print recognition module according to claim 1, the method comprising:
 scanning the respective photo sensors in the photo sensor array to recognize the print; and
 driving the synchronous scan component to form the first light transmitting area at least in an area above a photo sensor being scanned to recognize the print, and to form the first light shielding area in an area other than the first light transmitting area, when the respective photo sensors are being scanned to recognize the print.

12. The driving method according to claim 11, wherein scanning the respective photo sensors in the photo sensor array to recognize the print comprises:
 scanning the respective photo sensors in the photo sensor array via a row scan mode or a column scan mode to recognize the print.

13. The driving method according to claim 12, wherein driving the synchronous scan component to form the first light transmitting area at least in the area above the photo sensor being scanned to recognize the print comprises:
 driving the synchronous scan component to form the first light transmitting area extending in a row direction at least in an area above a row comprising the photo sensor being scanned to recognize the print, when the respective photo sensors in the photo sensor array are being scanned via the row scan mode to recognize the print; or
 driving the synchronous scan component to form the first light transmitting area extending in a column direction at least in an area above a column comprising the photo sensor being scanned to recognize the print, when the respective photo sensors in the photo sensor array are being scanned via the column scan mode to recognize the print.

14. A display device, comprising a display module and a print recognition module; wherein the print recognition module comprises:
 a photo sensor array comprising a plurality of photo sensors for recognizing a print; and
 a synchronous scan component arranged above a sensing surface of the photo sensor array, wherein:
 when respective photo sensors in the photo sensor array are recognizing the print, the synchronous scan component is configured to have a first light shielding area and a first light transmitting area, both of which are varying dynamically, wherein the first light transmitting area is formed at least above a photo sensor being scanned to recognize the print, and the first light shielding area is the other area of the synchronous scan component than the first light transmitting area.

15. The display device according to claim 14, wherein the display module is a top-emitting OLED display panel, the print recognition module is arranged below a display area of the top-emitting OLED display panel, and the synchronous scan component in the print recognition module is located between the photo sensor array, and the top-emitting OLED display panel.

16. The display device according to claim 14, wherein the print recognition module is arranged in a non-display area of the display module.

17. The display device according to claim 16, wherein the display module is an OLED display panel or a liquid crystal display panel.

* * * * *